United States Patent [19]
Scheer

[11] Patent Number: 5,649,224
[45] Date of Patent: Jul. 15, 1997

[54] INTEGRATED CIRCUIT CARD HAVING CONTACTS ALONG THE SIDE RAILS AND METHOD FOR TRANSFERRING INFORMATION USING THE CONTACTS

[75] Inventor: David C. Scheer, Pollock Pines, Calif.

[73] Assignee: Intel Corporation, Santa Clara, Calif.

[21] Appl. No.: 9,135

[22] Filed: Jan. 26, 1993

[51] Int. Cl.$^6$ .......................... G06F 13/40; G11B 5/012; H05K 1/14
[52] U.S. Cl. .................... 395/800; 364/DIG. 1; 364/DIG. 2; 361/737; 361/684; 395/309; 395/282; 395/281
[58] Field of Search .......................... 395/800, 200, 395/250, 275, 325, 500, 550, 750, 775, 282, 281, 309; 361/718, 719, 720, 721, 722, 723, 733, 737, 760, 761, 769, 764, 791, 796, 813, 807, 724, 785, 686; 235/486, 492, 379, 380; 237/148 B, 434, 435; 364/DIG. 1, DIG. 2, 410, 708.1; 439/377, 55

[56] References Cited

U.S. PATENT DOCUMENTS

| | | | |
|---|---|---|---|
| Re. 34,369 | 9/1993 | Darden et al. | 364/708.1 |
| 4,530,069 | 7/1985 | Desruchers | 395/275 |
| 4,695,925 | 9/1987 | Kodai et al. | 235/492 |
| 4,811,165 | 3/1989 | Currier et al. | 361/736 |
| 4,951,280 | 8/1990 | McCool et al. | 340/825.05 |
| 5,183,404 | 2/1993 | Aldous et al. | 439/55 |
| 5,184,282 | 2/1993 | Kaneda et al. | 361/737 |
| 5,272,477 | 12/1993 | Tashima et al. | 340/870.16 |
| 5,285,057 | 2/1994 | Murohara | 235/492 |
| 5,296,692 | 3/1994 | Shino | 235/486 |
| 5,296,850 | 3/1994 | King | 340/825.49 |
| 5,303,121 | 4/1994 | Thornberg | 361/760 |
| 5,313,364 | 5/1994 | Omori et al. | 361/785 |
| 5,315,478 | 5/1994 | Cadwell et al. | 372/26 |
| 5,366,385 | 11/1994 | Treleaven | 439/377 |
| 5,375,037 | 12/1994 | Le Roux | 361/684 |

OTHER PUBLICATIONS

No author, *PCMCIA, Personal Computer Memory Card International Association PC Card Standard*, Release 2.0, 3–13 through 3–26 (Sep. 1991).

No author, *PCMCIA Recommended Extensions*, Release 1.00, 1–3 through 1–8 (1992).

*Primary Examiner*—Daniel H. Pan
*Attorney, Agent, or Firm*—Blakely, Sokoloff, Taylor & Zafman

[57] ABSTRACT

A method and apparatus for propagating signals between a PC card and a computer system. The method and apparatus includes using contacts on the card edge to route signals between the card and components within the computer system. In this manner, a PC card is not limited to transferring signals solely over its standard connection interface.

13 Claims, 5 Drawing Sheets

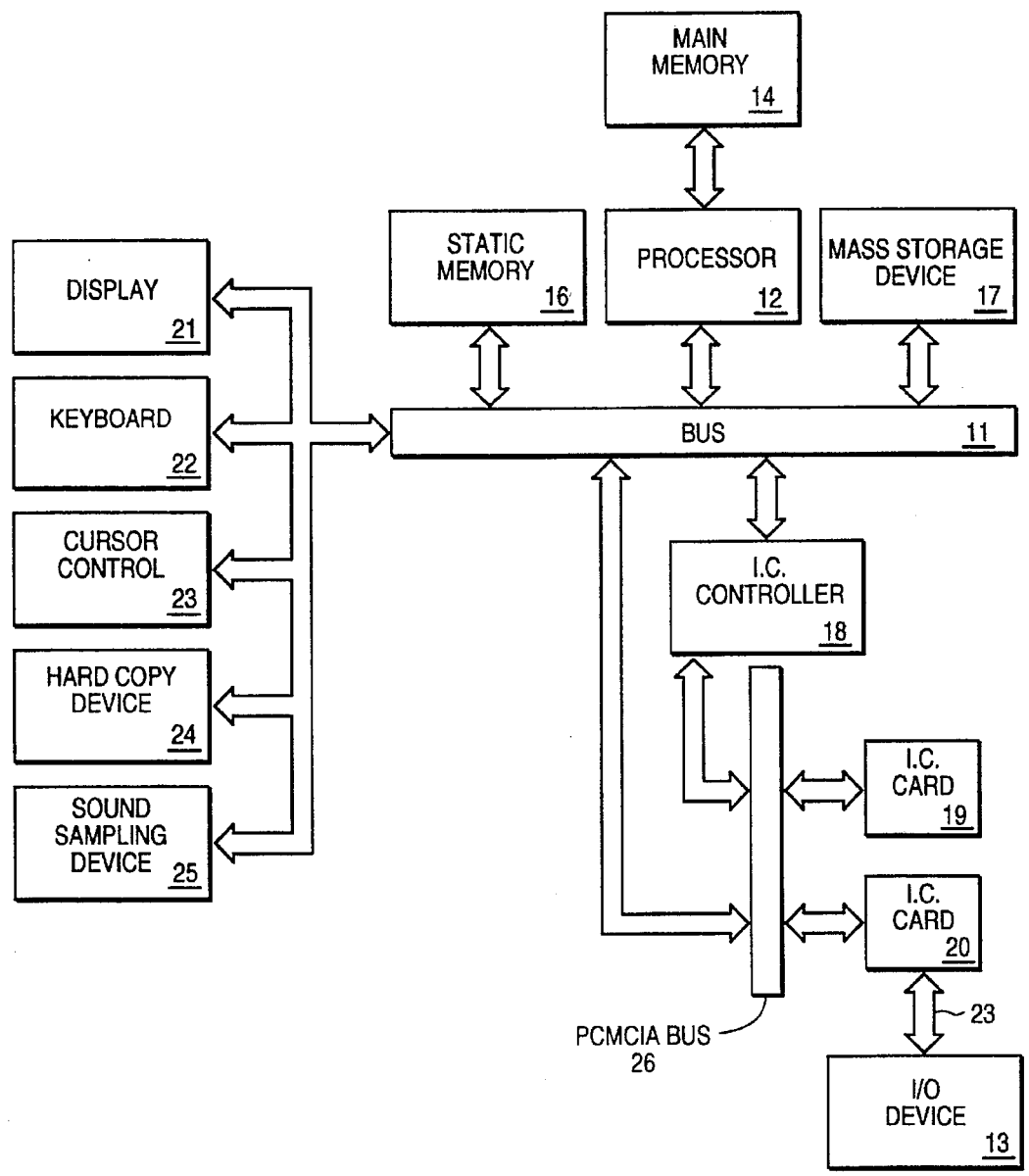
FIG_1

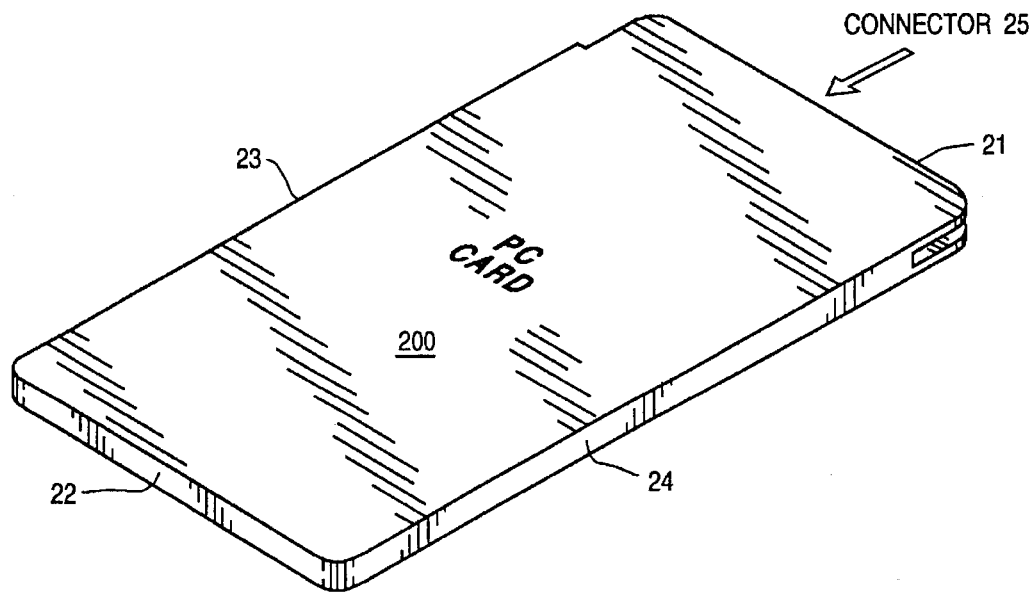
FIG_2A
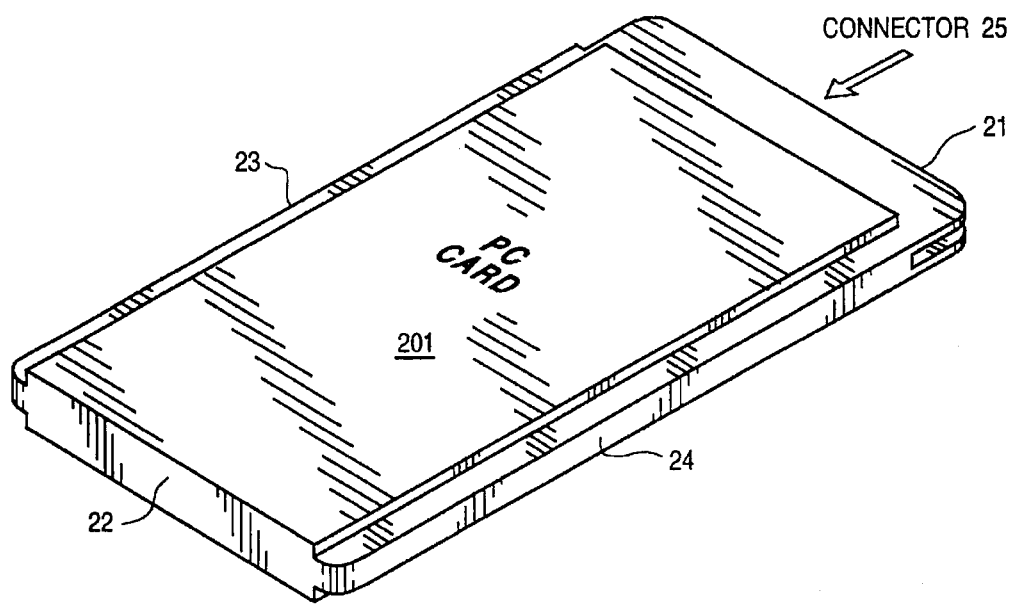
FIG_2B

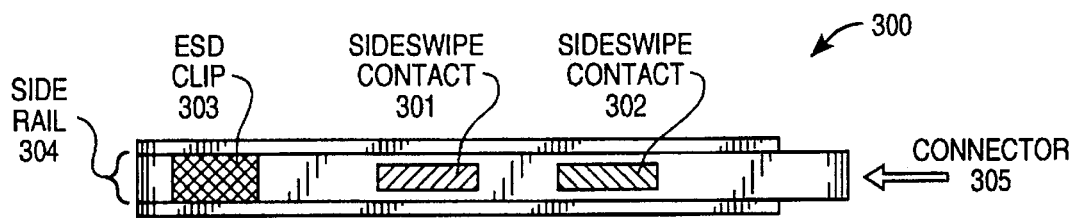
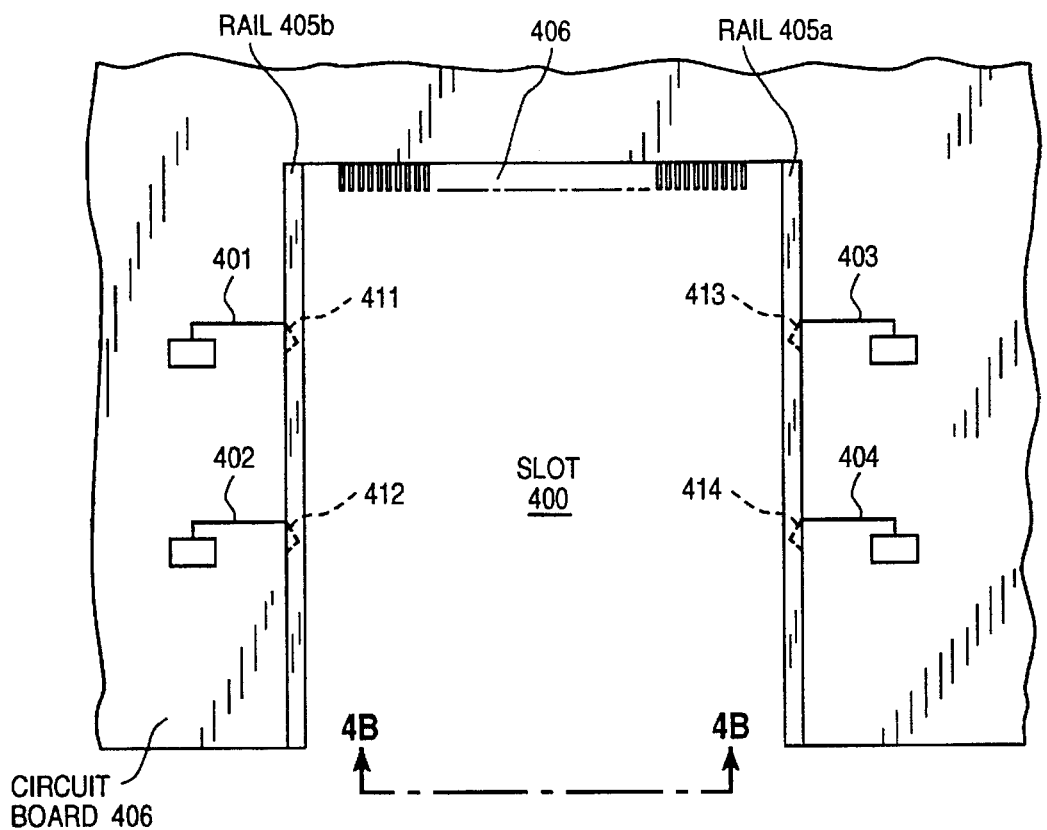
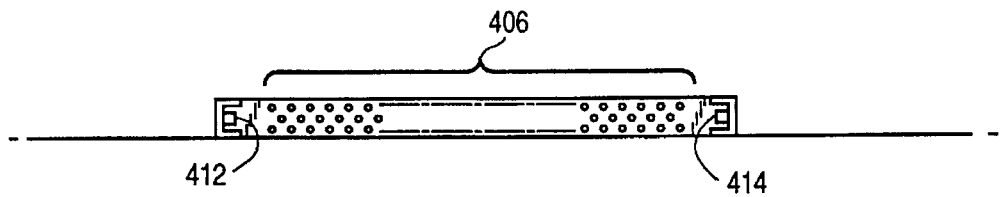

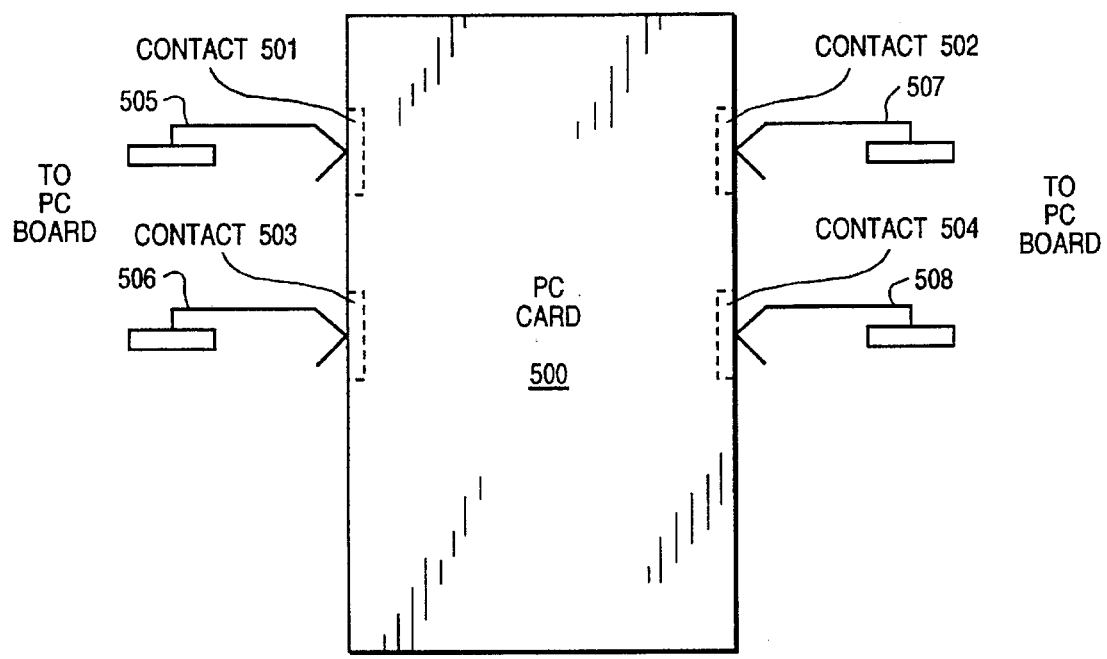
FIG_5
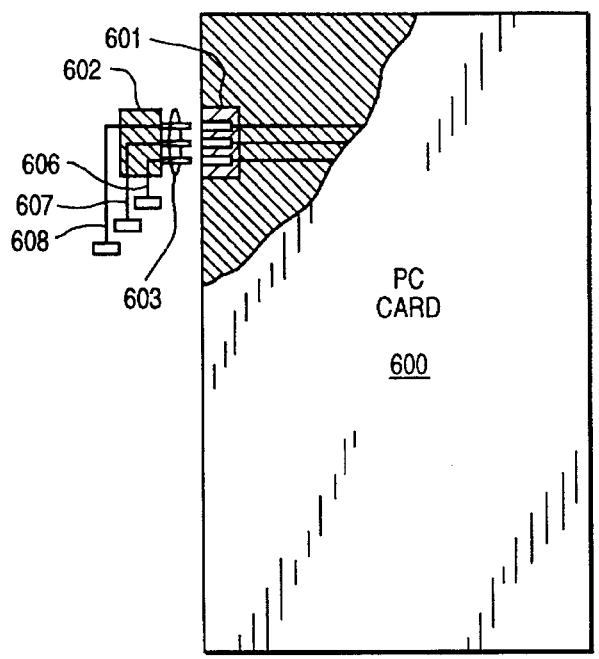
FIG_6

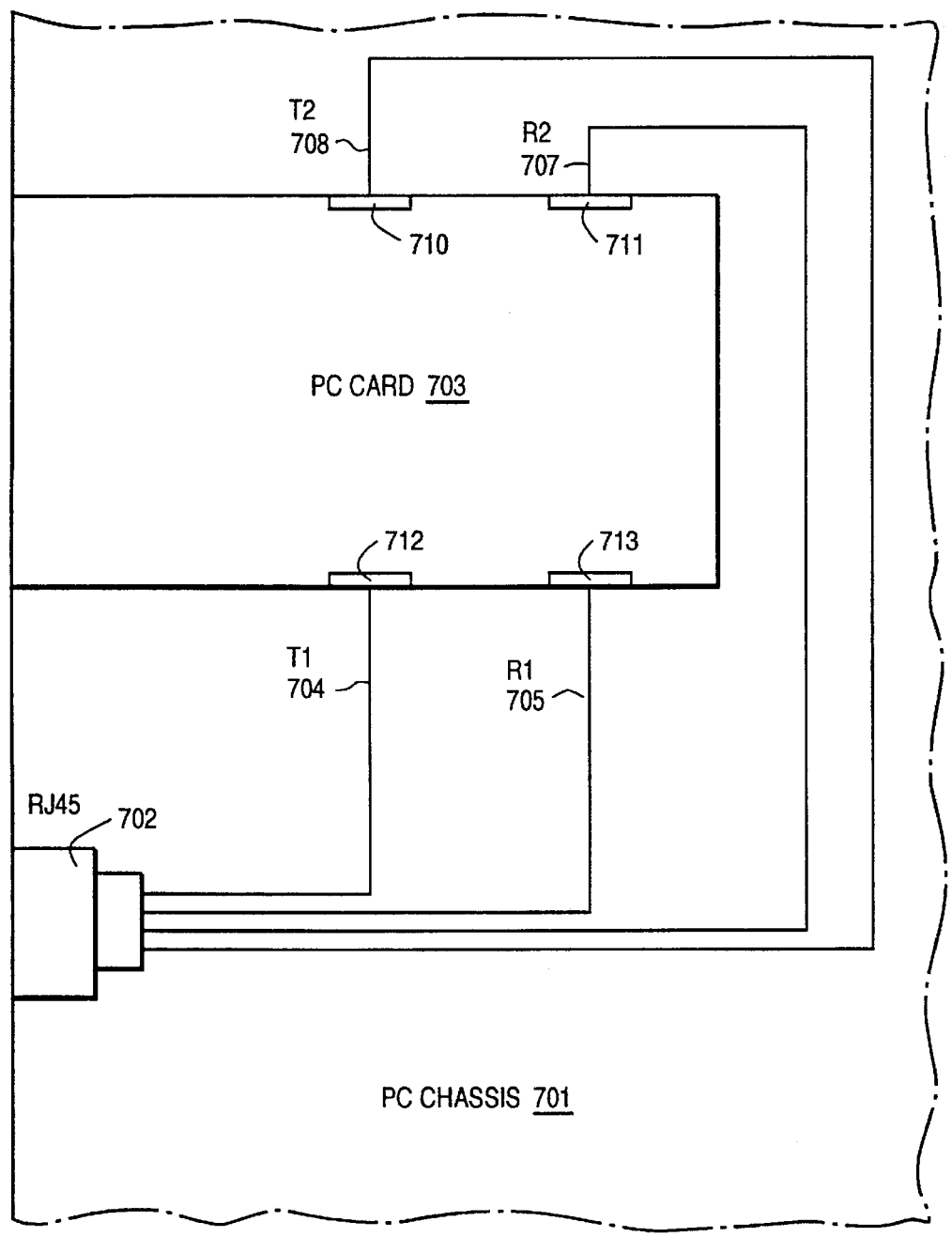
FIG_7

INTEGRATED CIRCUIT CARD HAVING CONTACTS ALONG THE SIDE RAILS AND METHOD FOR TRANSFERRING INFORMATION USING THE CONTACTS

CROSS-REFERENCE TO RELATED APPLICATIONS

The following U.S. patent applications relate to the present application. Each of the listed applications are assigned to the same assignee as the present application.

1) U.S. patent application Ser. No. 08/249,290, Filed May 26, 1994, and titled, "MODULAR COMMUNICATIONS CONNECTOR FOR I/O CARD APPLICATIONS", now U.S. Pat. No. 5,423,697;

2) U.S. patent application Ser. No. 08/243,228, Filed May 13, 1994, and titled, "INTEGRAL EXTERNAL CONNECTOR INTERFACE FOR THIN FORM FACTOR COMPUTER CARDS", now U.S. Pat. No. 5,505,633;

3) U.S. patent application Ser. No. 08/241,722, Filed May 12, 1994, and titled, "INTERCONNECTION SCHEME FOR INTEGRATED CIRCUIT CARD WITH AUXILIARY CONTACTS", now U.S. Pat. No. 5,445,505;

4) U.S. patent application Ser. No. 08/234,481, Filed Apr. 28, 1994, and titled, "KEYING NOTCHES FOR SIDE CONTACTS ON A THIN FORM FACTOR COMPUTER CARD".

FIELD OF THE INVENTION

The present invention relates to the field of integrated circuit cards; particularly, the present invention relates to a method and apparatus for obtaining signals from a credit-card sized integrated circuit card by other than its standard interfaces.

BACKGROUND OF THE INVENTION

One of the most rapidly growing markets for computer systems is the portable computer market. Recently, portable computers have become more powerful, while also becoming smaller and lighter. Furthermore, as a part of this changing market, the various computer components have become smaller and lighter while their ability to handle more data has increased.

One group of devices which is especially important to portable computers include peripheral input/output devices such as modems, facsimile machines, or local area networks (LANs). A modem, for example, allows a user of a portable computer to correspond with other computers using the telephone lines. A modem provides access to all the data available at the base office without the need to store that data in a portable computer. Consequently, the reduction in size of modems occurred at the same time as the reduction in size of other components, such as hard disks. Typically, electronics for a computer, such as that of a modem, are arranged on an internal board within the computer. Some arrangements provide separate portable electronics which may be carried along and attached to a portable computer when needed. Furthermore, some electronics, modems in particular, have been designed recently which plug into sockets recessed within the body of a portable computer.

Historically, each of the peripheral devices (e.g., modems, facsimile, LANs, etc.) has required its own interface circuitry for connecting to the internal circuitry of a portable computer. This interface circuitry required a separate socket for each device (and thus, required extra space in the internal circuitry of the portable computer). The interface circuitry allowed the peripheral devices to be coupled in order to access the necessary electronics and hardware to provide the device function. For instance, the interface to a modem provides the necessary means for coupling a jack for its operation.

Recently, devices have been devised which allow some of these various forms of computer components to be plugged into the same socket of computer, thereby reducing the space required within the portable computer. For example, an international standard which defines the physical and electrical interface specifications for the interchangeability of memory and input/output cards was introduced by Personal Computer Memory Card International Association (PCMCIA) jointly with the Japanese Electrical Industry Association (JEIDA) in September of 1991. In addition, a specification referred to as an Exchangeable Card Architecture (ExCA) specification, Dec. 20, 1991, has been issued by Intel Corporation of Santa Clara, Calif. The ExCA document describes specifications which manufacturers may use to provide interfaces which are ensured of allowing the memory and input/output cards for portable personal computers of different manufacturers to be interchanged.

A socket design to these specifications allows cards, such as modem and flash memories to be attached, used, and removed interchangeability in the same socket. Computer systems typically include at least one socket recessed within the computer, such that the inserted components (e.g., modem, LAN, etc.) are protected by the body of the computer surrounding the interface circuitry (i.e., socket) in which the components are to be coupled.

The PCMCIA specification provides that the personal computer cards have a sixty-eight pin connector located at the end of the card for the sending and receiving of signals by the card. Currently, the only means of gaining access to signals is through this sixty-eight pin connector. However, only one of the 68 pin placements remains undefined (pin 57). Therefore, only one of the pins may be used to propagate an application specific signal. Many system manufacturers desire to connect critical signals which are not available through the sixty-eight pin connector. Therefore, it is desirable to have access to signals on the personal computer cards other than those which are provided by the standard interface.

Recently, efforts have been made to obtain signals from personal computer cards using external connectors. These external connectors allow for input/output signals to be obtained directly from the card without using its standard interface. For instance, external connectors have been made which connect to integrated circuit cards to obtain access to signals by other than the standard interface (e.g., a PCMCIA standard interface). To implement the external connection, each of the cards contains multiple pins, other than those designated in the 68 pin connector interface, that can be mated with a socket of an external connector. Such connectors are often used to provide signals to jacks, such as Bell Laboratories RJ11 and RJ45 jacks, and other proprietary jacks. Such a connector system is described in co-pending application, Ser. No. 07/782,210, entitled "Integral Connector System for Credit Card Size I/O Card External Connector," filed Oct. 24, 1991, and assigned to the assignee of the present invention. Efforts are currently being taken to create a standard for the external connector type interfaces.

One problem that exists with such an external connector system is that a portable computer user is required to carry all of the external hardware necessary to effectuate the connections. Since the external connection systems employed are dependent on the type of card in use, the portable computer user would be required to carry multiple external connectors to accommodate each of the distinct cards that may be inserted into the computer system. This is often burdensome and increases the overall cost to the system user, since each of the separate external connectors must be purchased. However, signals, and the circuitry responsible for their generation and/or use, other than those provided for by the standard interface (i.e., the 68 pins), are still required to provide the card's functionality. For example, for a modem card to operate, signals still must be provided to a telephone line (i.e., a jack). Thus, it is desirable to eliminate the use of external connectors in conjunction with insertable personal computer cards, yet still be able to obtain signals from the cards by other than their standard interface.

SUMMARY Of THE INVENTION

It is the object of the invention to increase the integrated circuit card reliability by eliminating the external connection.

It is another object of the invention to allow all the components of the computer system to be completely integrated within the computer environment.

It is still another object of the invention to include less items for the computer user to carry higher integration, and more flexibility.

These and other objects of the invention are provided for by a method and apparatus for propagating signals to and from integrated circuit (IC) cards. The present invention provides a personal computer for use in a computer system that has logic circuitry for performing a designated function. The present invention also includes a standard interface connector for transferring signals between the computer system and a IC card. In the current preferred embodiment, the connector comprises multiple pins. The card includes a frame that provides support structure for the logic circuitry and a connector interface such that the logic circuitry is enclosed and the connector interface are held in place for electrical connection upon insertion of the card into the computer system. The IC card also includes at least one contact which routes signals between the card and an external receptacle located in the computer system, such that a signal may propagate between the card and the computer system by other than the standard interface.

BRIEF DESCRIPTION OF THE DRAWINGS

The present invention will be understood more fully from the detailed description given below and from the accompanied drawings of the preferred embodiments of the invention, which, however, should not be taken to limit the invention to the specific embodiments, but are for explanation and understanding only.

FIG. 1 is a block diagram of the computer system of the present invention.

FIGS. 2A and 2B each illustrate an embodiment of the personal computer card of the present invention.

FIG. 3 illustrates an example of the sideswipe contact of the present invention.

FIGS. 4A and 4B illustrate the card slot for receiving personal cards for connection with the computer system.

FIG. 5 illustrates one embodiment of the connection scheme utilizing the sideswipe contact of the present invention.

FIG. 6 illustrates one embodiment of the connection scheme for the contact of the present invention.

FIG. 7 illustrates an example of a sideswipe contact implementation.

DETAILED DESCRIPTION OF THE PRESENT INVENTION

A method and apparatus for propagating signals between a personal computer card and a computer system are described. In the following description, numerous details are set forth such as specific numbers of contacts, types of contacts, size of contacts, and types of signals, etc., in order to provide a thorough understanding of the present invention. It will be obvious, however, to one skilled in the art that the present invention may be practiced without these specific details. In other instances, well-known structures and devices are shown in block diagram form, rather than in detail, in order to avoid unnecessarily obscuring the present invention.

The present invention is advantageously employed in computer system design optimized for applications with lower power consumption and compact size. Such applications typically include small battery-powered personal computers of the type commonly referred to as laptops and notebooks. One preferred embodiment of such computer system is briefly described below; however, it is to be understood that the present invention is not limited to this particular computer system design and may be incorporated into virtually any processor-based system design.

Referring to FIG. 1, the preferred embodiment of the computer system of the present invention is shown. In the preferred embodiment, the computer system includes a 486SL™ brand microprocessor manufactured by Intel Corporation of Santa Clara, Calif., the assignee of the present invention. Such computer system is compatible with the IBM™ PC AT Personal Computer. It will be understood while FIG. 1 is used for providing an overall description of the computer system of the present invention, a number of the details of the system are not shown. As necessary for disclosure of the present invention, further details set forth with reference to the other figures provided with this specification.

The computer system as may be utilized by the preferred embodiment of the present invention generally comprises a bus for communication means 11 for communicating information, processing means 12 coupled with bus 11 for processing information, a random access memory (RAM) or other dynamic storage device 14 coupled with processing means 12 for storing information and instructions for processing means 12, a read only memory (ROM) or other non-volatile storage device 16 coupled with bus 11 for storing non-volatile information and instructions for processing means 12, a data storage device 17, such as a magnetic disk or disk drive, coupled with bus 11 for storing information and instructions, a display device 21, such as a cathode ray tube, liquid crystal display, etc., coupled to bus 11 for displaying information to the computer user, an alpha-numeric input device 22 including alpha-numeric and other keys, etc., coupled to bus 11 for communicating information and command selections to processor 12, and cursor control 23 coupled to bus 11 for controlling cursor movement. The computer system also includes a hard copy device 24, such as a plotter of printer, for providing visual representation of the computer images. Hard copy device 24 is coupled with processor 12, main memory 14, non-volatile 16 and mass storage device 17 through bus 11. The computer system also includes a sound recording and playback device 25 coupled to bus 11 for providing audio recording and playback.

Integrated circuit cards 19 and 20 are included in the computer system and are coupled to PCMCIA bus 26. Note that although the computer system only shows two IC cards, the number of IC cards which may be coupled to the computer system may vary. In the currently preferred embodiment, IC cards 19 and 20 are PCMCIA cards. PCMCIA bus 26 is coupled to bus 11 and to integrated circuit (IC) controller 18 for providing communication information between cards 19 and 20 and the remainder of the computer system. In the currently preferred embodiment, PCMCIA bus 26 is a standard PCMCIA bus for communicating information according to the PCMCIA standard. Note that although IC cards 19 and 20 and PCMCIA bus 26 of the present invention communicate according to the PCMCIA standard, other interface types and configurations fall within the scope of the present invention. IC controller 18 provides control and address information to IC cards 19 and 20 via PCMCIA bus 26 and is coupled to bus 11. Also note that although the cards are shown coupled to PCMCIA bus 26, in the currently preferred embodiment the cards are not coupled to PCMCIA bus 26 until they are inserted into slots in the side of the computer, such that their standard interface (e.g., 68 pin PCMCIA standard interface) is mated with the interface pins (e.g., the 68 pins) within the computer system.

The computer system also includes a signal path or bus 31 (i.e., sideswipe contact bus) for communicating information to IC card 20 by other than its standard interface. In one embodiment, signal path/bus 31 may only transfer one signal, while in other embodiments, bus 31 provides the signal path for multiple signals. Note that IC card 19 may be coupled to sideswipe contact bus.

Finally, the computer system includes input/output (I/O) device 13 for providing an input/output port or connector for the computer system. I/O device 13 is coupled to signal path/bus 31 for access to signals from IC card 20. In another embodiment, I/O device 13 could also be coupled to bus 11 for communication with the remainder of the computer system. In one embodiment, I/O device 13 comprises a jack or plug, such as an RJ11 jack, RJ45 jack or other proprietary or telephone port that is coupled to the PC chassis for input and output. I/O device 13 can also include an infra-red antennae or a radio-frequency antennae or other communications device. Note that although only one I/O device is shown, the computer system of the present invention may include multiple I/O devices and multiple I/O device may be coupled to an IC card.

Of course certain implementations and uses of the present invention may not require or include all of the above components. For example in certain implementations a keyboard and cursor control device for inputting information to the system may not be required. In other implementations, it may not be required to provide a display device for displaying information. Also, some components may be coupled in other configurations. For instance, main memory 14 may be coupled directly to bus 11 instead of being coupled to processor 12 directly.

FIGS. 2A and 2B illustrate two embodiments of the integrated circuit cards of the present invention. FIG. 2A illustrates IC card 200 which is a Type 1 IC card according to the PCMCIA PC card 2.0 standard. FIG. 2B illustrates IC card 201 which is a Type 2 IC card according to the PCMCIA PC card 2.0 standard. Integrated circuit cards adhering to the PCMCIA standard are often referred to as PC cards. Each card includes a frame which has front and back ends 21 and 22 respectively and opposite sides 23 and 24. Connector 25 is mounted at the front end of the frame and has multiple pin sockets for coupling the IC card to the computer system. In the current preferred embodiment, connector 25 has 68 sockets such that when either of IC cards 200 and 201 is inserted into the slot in the computer, each of the sockets in connector 25 mates with one of 68 pins to provide an electrical connection. Connector 25 constitutes the standard interface of the IC card. In the currently preferred embodiment, connector 25 requests the PCMCIA standard 68 pin interface connector. Each of IC cards 200 and 201 could include a proprietary connector (not shown) at back end 22 for connection of a connector external to the computer system for transferring signals by other than the standard interface.

Within IC card 200 and 201 is a circuit board assembly that is mounted to the frame which includes a circuit board upon which multiple circuit components are mounted. The circuit board, in conjunction with the circuit components, provides a designated function to the computer system. In other words, each of the cards provides an architecture for performing a designated function for the computer system. For example, a local area network card for connecting the computer system to a local area network includes circuit components designed to provide the protocol and handshaking necessary to achieve the LAN hook-up. In other embodiments, a particular IC card could act as a modem or a facsimile. Note that in other embodiments, IC cards 200 and 201 could provide a variety of input/output functions. For instance, card 200 or 201 could provide for radio frequency or infrared communications. The manner in which the functional components in the circuit board assembly operate and provide signals to the computer system through its socket connections is well-known in the art.

Referring to FIG. 2A, IC card 200 has a thickness height of 3 mm, a length of 85.60 mm, and a width of 10 cm. Referring to FIG. 2B, the thickness of IC card 200 is 3 mm at the outer edges and 5 mm in the inner portion of the card. The length and width of IC card 201 are 85.6 mm and 10 mm respectively. Note that although the dimensions are for IC card 200 and IC card 201 are specified according to the PCMCIA 2.0 standard, other types of cards may be used with the present invention. For example, extensions have been recommended to the PCMCIA standards that include an extended version of IC card 200 and an extended version of IC card 201. In the extended versions, the dimensions are exactly the same except for an extended portion which remains outside the computer when the card is inserted into the slot. In one embodiment, the extended portion extends 10 mm past the standard IC card length of 85.6 mm. The height may be increased in the extended portion (i.e., referred to as a bubble area). It should be noted that in one embodiment of the extended bubble portion, the thickness from the center line of the connector to the bottom of the PC card is the same thickness for the entire length and the distance from the center line of the connector to the top of the bubble is 8 mm. In another embodiment, a card, commonly referred to as a Type 3 card, has been recommended to be added to the PCMCIA standard to accommodate thicker devices. In the Type 3 card, the body may have a thickness of greater than 5 mm. The present invention can be utilized in conjunction with any of the embodiments of the PCMCIA cards or other types of insertable personal computer cards.

Although each of the cards of the currently preferred embodiment only perform one function, the present invention is capable of operating with cards which perform multiple functions. The present invention finds considerable applicability to situations where multiple functions are performed on one card and more signals are required between the card and the computer system that can be provided in a standard interface (e.g., a standard 68 pin interface). Therefore, the other signals which are designed for communication between the card and the computer system can be provided by the present invention.

FIG. 3 illustrates the contact for signal propagation on IC cards according to the present invention. Referring to FIG. 3, IC card 300 is a Type 2 PCMCIA card. The side view of a IC card 300 is shown with connector 305 and side rail 304. Side rail 304 contains electrostatic discharge (ESD) clip 303 for discharging electrostatic charge and sideswipe contacts 301 and 302 for propagating signals between the card and the computer system. Note that although in the currently preferred embodiment, IC card 300 includes ESD clip 303, the present invention is not restricted to those cards which employ such an ESD configuration. Furthermore, although only two sideswipe contacts are shown, the present invention is capable of having more or less contacts depending on the requirements of the application card type. The number of contacts which a card can utilize is limited by the physical size of the contacts.

Sideswipe contacts 301 and 302 in the present invention allow the use of the edge of the card frame to route signals located on the card to an external receptacle (e.g., a jack, antenna, etc.) located on the circuit board of the system and vice versa. The manner in which the signals are routed from on the IC card to the contact for propagation is accomplished in the same manner as signals propagate to the standard interface. The exact mechanism to route the signals from the card through the personal computer (PC) board varies depending on which contact scheme is utilized and the number of signals which are to be propagated. Each contact is responsible for supplying one signal between IC card and the computer system. The location of contacts 301 and 302 of the present invention is dependent on the configuration of the external receptacle located on the circuit board. The external receptor must allow for signals to be routed from the card and onto the circuit board to the desired I/O or communications port or other computer system device.

The size of sideswipe contacts 301 and 302 is dependent on the contact scheme employed. There are numerous embodiments for the sideswipe contacts of the present invention. In one embodiment, the contacts may be flush along the side of the card edge. In the currently preferred embodiment, each contact is flush with the card edge and has a length of 5 mm and a width of 3 mm such that the contact runs along the card edge and does not extend beyond such an edge. The contact of the currently preferred embodiment does not extend beyond the edge, such that the cards containing the contacts of the present invention comply with the PCMCIA 2.0 standard. If a card employs a contact of the present invention and is not restricted to having a flush edge or preset width or height, then the embodiment of the contact utilized by the present invention may be allowed to extend beyond the edge rail. Also note that the contact does not have to extend the full width of the side rail.

The contact of the present invention is comprised of a high conductive material such as gold plated copper. In one embodiment, the contacts are formed of a material having a bulk resistivity that is no more than about one order of magnitude greater than that of copper (whose bulk electrical resistivity is 1.7-centimeter). The highly conductive contact regions make electrical contact to the external receptacle when the card is fully inserted into the slot along side the computer system, such that signals can propagate between the card and the computer system.

In other embodiments, the contacts could be recessed within the card. When the contacts are recessed, the external receptor making contact with the card upon insertion of the card into the computer system utilizes pins which extend into the card into the recessed contact, thereby making an electrical connection. In this manner, signals may be sent between the card and the circuit board through the pins. In one embodiment, the pins are spring loaded, such that when the card is fully inserted, the pins extend into the card to make the electrical connection. In other embodiments, a card locking mechanism which locks the card in place after it has been fully inserted could trigger the spring loaded pins. In this embodiment, each contact is responsible for receiving one pin to supply one signal between the PC card and the circuit board of the computer system. The number of recessed contacts is limited to the amount of recessed areas (i.e., holes) the frame can support. In other words, the number of recessed contacts is limited by the strength of the frame to support the holes for each pin. By using the sideswipe contacts of the present invention, the present invention provides a mechanism that allows system manufacturers to enact critical systems which are not available through the standard pin connector to the computer system.

FIGS. 4A and 4B illustrate the external receptacle located on the circuit board of the system for receiving the IC card into the computer system. Some of the electrical connectors between the external receptor and the circuit board have been omitted to avoid obscuring the present invention. Referring to FIGS. 4A, the external receptacle is shown with rails 405A and 405B, connector pins 406 and sideswipe contact points 411–414. Each of sideswipe contact points 411–414 is coupled to the circuit board using electrical conductors 401–404 respectively. Upon insertion of a card into slot 400, the connector of the card mates with pins 406, such that an electrical connection is made between the two. When the card is completely in the slot and the pins mated with the connector for the card, contact points 411–415 make electrical connection with the sideswipe contacts on the side of the card, such that signals can be transferred between the card and the PC board of the computer system. Note that contact points 411–414 are comprised of angled pieces of metal. These angled portions could be rounded or sharply bent electrically conductive materials. However, in one embodiment, the materials are flexible, such that upon insertion of the card into the slot, the contact points 411–414 flatten substantially between the rail and the card. FIG. 4B illustrates one embodiment of the side view of the external receptacle depicting how contact points 412 and 414 extend from this rail.

FIG. 5 illustrates the sideswipe contacts 501–504 on IC card 500 making contacting with the PC board through electrical connections 505–508 respectively. To reiterate, the number of contacts is dependent upon the application and each contact is used for signal propagation. Note that in FIG. 5 the external receptacle on the circuit board is employing the bent angled metal connection scheme.

FIG. 6 depicts the spring loaded pin configuration for the sideswipe contact of the present invention. Referring to FIG. 6, the spring loaded configuration is shown in relation to IC card 600. IC card 600 contains a socket connector 601, shown having three receptors for pins. Socket connector 601 is a socket connector that is additional to the standard interface connector. Circuit board 602 is shown with spring loaded pins 603, wherein three pins are shown for coupling three distinct signals to the circuit board 602 via conductors 606–608. In a spring loaded, or pogo pin, type configuration, the pins are only inserted into the IC card once the IC card is fully inserted into place. In one embodiment, the pins are not inserted until the IC card is locked into place. Upon attempting to eject the IC card 600, the pins retract from the recessed contact area, such that the card may be released from the computer system.

FIG. 7 shows an example of the sideswipe contact implementation for a local area network IC card. Referring to FIG. 7, IC card 703 is a local area network card having four contacts 710–713. Contacts 710 and 711 are on one edge of the card frame, while 712 and 713 are on the other side of the IC card frame. IC card 703 is shown inserted into the PC chassis 701. Also, on the circuit board of PC chassis 701 is a RJ45 jack 702. RJ45 is an eight conductor jack of which four conductors are used as per the IEEE 802.3 Twisted Pair Ethernet (TPE) specification. Upon insertion into the computer system, PC card 703 provides propagation paths for four signals which are routed on the circuit board between the four separate conductors of RJ45 jack 702 and the four separate contacts of IC card 703. Contact 710 provides for signal propagation of one tip signal which is routed on conductor 708 to RJ45 jack 702. A ring signal is provided from contact 711 to conductor 707 to the RJ45 jack 702. Another set of tip and ring signals is provided by contact 712 and 713 respectively and travels from contact 713 and 712 using conductor 704 and 705 respectively. In this manner, the IC card 703 is able to send signals to components in the computer system without having to use the standard connector designated. In a modem implementation, only one pair of telephone wires (i.e., one tip and one ring) are necessary, such that only two contacts would be required for the additional two signals. In the example modem implementation, a RJ11 jack may be used.

Using the present invention, system manufacturers are allowed to integrate components, such RJ11, RJ45 and proprietary jacks on board the computer system. Without using such contacts, the necessary signals for such jacks would have to be external to the system and signals provided to them through external connectors off the end of the IC card.

Furthermore, the present invention provides the ability to increase functionality while maintaining conforming and compliance with the current PCMCIA 2.0 specification. This is due to the ability to incorporate more hardware into the computer system, such as jacks, antennas, etc. to facilitate the functions provided by the cards. In this manner, the system manufacturers are allowed to differentiate their product lines while incorporating proprietary use of the contacts.

Whereas many alterations and applications of the present invention will no doubt become apparent to a person of ordinary skill in the art after reading the foregoing description, it is understood that the particular embodiments shown and described by illustration are in no way intended to be limiting. Therefore, references to details of the preferred embodiments are not intended to limit the scope of the claims which themselves recite only those features regarded as essential to the invention.

Thus, a method and apparatus for propagating signals between a personal computer card and the remainder of the computer system has been described.

I claim:

1. A PCMCIA card for use in a computer system, wherein the computer system includes at least one circuit board, said card comprising:

a circuit board assembly having a plurality of circuit components to perform a designated function;

a PCMCIA connector coupled to the circuit board assembly to transfer a plurality of signals between the circuit board assembly and said at least one circuit board;

a card housing coupled to the circuit board assembly and the PCMCIA connector and adhering to the PCMCIA standard, the card housing providing a support structure for the circuit board assembly and the PCMCIA connector, such that the circuit board assembly and the PCMCIA connector are held in place for connection in the computer system, wherein the card housing comprises a plurality of flat side rails; and a substantially flat contact area coupled to extending along, and flush with a substantially outermost edge of one of the plurality of flat side rails to route a signal between the circuit board assembly and said at least one circuit board in the computer system when the PCMCIA connector is coupled to a first external receptacle in the computer system, such that said contact area provides signal propagation between the card and the computer system.

2. The PCMCIA card as defined in claim 1 wherein said at least one flat contact is recessed into said one of the plurality of flat side rails.

3. The PCMCIA card as defined in claim 1 wherein at least one second flat contact is coupled to another of the plurality of flat side rails for routing at least a second signal between the circuit board assembly and said at least one circuit board in the computer system, such that said at least one second flat contact provides signal propagation between the PCMCIA card and the computer system.

4. The card as defined in claim 1 wherein said at least one contact comprises a electrically conductive material.

5. A PCMCIA card for use in a computer system comprising:

a circuit board assembly generating a first plurality of signals necessary to perform a designated function;

a PCMCIA connector having a plurality of pin receptors coupled to the circuit board assembly transferring the first plurality of signals from circuit board assembly to at least one circuit board in the computer system and a second plurality of signals from said at least one circuit board to the circuit board assembly;

a card frame adhering to the PCMCIA standard and coupled to the circuit board assembly and the plurality of pin receptors for holding the circuit board assembly and the plurality of pin receptors in place, wherein the card frame holds the plurality of pin receptors in position at one end, and wherein the card frame includes first and second flat side rails substantially perpendicular to said one end; and a substantially flat contact area coupled to and extending along and flush with a substantially outermost edge of the first flat side rail for propagation of a signal between the circuit board assembly and at least one external receptacle located in the computer system such that signals propagate between the computer system and the card through both the plurality of pin receptors of the PCMCIA connector and said contact area.

6. A PCMCIA card interface for interfacing a PCMCIA card in a computer system, wherein the PCMCIA card includes at least one substantially flat contact area extending along and flush with one of the side rails and a PCMCIA connector with a plurality of pin sockets, the PCMCIA card interface comprising:

a personal computer board coupled to the computer system;

a PCMCIA card receptacle coupled to the board for receiving and coupling the PCMCIA card to the computer system using a plurality of pins and said at least one flat contact area, such that a first electrical connection occurs between the card and the computer system for transferring signals when the plurality of pins are inserted into the plurality of pin sockets, wherein a second electrical connection occurs between each said at least one flat contact area and said connector receptacle when the PCMCIA card is inserted into the connector receptacle, such that signal propagation occurs between the PCMCIA card and the computer system via both the first interface and said at least one flat contact.

7. The PCMCIA card interface as defined in claim 6 wherein the card receptacle further comprises rails for holding the PCMCIA card when the PCMCIA card is inserted into the PCMCIA card interface, and wherein the second electrical connection occurs between said at least one flat contact and the rails holding the card.

8. The PCMCIA card interface as defined in claim 6 wherein said PCMCIA card receptacle further comprises a conductor material formed and positioned to make an electrical connection automatically to said at least one flat contact when the PCMCIA card is fully mated with the PCMCIA card interface.

9. A computer system comprising a bus means for communicating data and communications; a processor; a memory means for storing data and instructions; wherein the bus means, microprocessor and memory means are coupled to a chassis;

a PCMCIA card having a PCMCIA connector, a plurality of flat side rails, and having at least one substantially flat contact area extending along and flush with one of the plurality of flat side rails;

a PCMCIA card interface coupled to the chassis for electrically interfacing the PCMCIA card to the chassis, wherein the PCMCIA card interface comprises a plurality of pins and at least one conductor, and further wherein electrical connection occurs between the plurality of pins and the PCMCIA connector of the PCMCIA card and between each said at least one flat contact area and each said at least one conductor when the PCMCIA card is inserted into the PCMCIA card interface;

an input/output (I/O) means coupled to the chassis and to said at least one conductor for providing input and output signals for the computer system, wherein said at least one signal is electrically coupled between the PCMCIA card and the I/O means via said at least one conductor and the chassis, such that at least one signal is routed between the PCMCIA card and the I/O means using said at least one flat contact.

10. The computer system as defined in claim 9 wherein the I/O means comprises a jack.

11. The computer system as defined in claim 9 wherein the I/O means comprises a jack mounted on the chassis, and further wherein the PCMCIA card comprises a local area network card having a plurality of flat contacts to coupled at least one tip and at least one ring circuit to the jack.

12. The computer system as defined in claim 9 wherein the I/O means comprises a jack mounted on the chassis, and further wherein the PCMCIA card comprises a modem card having at least one flat contact to electrically couple tip and ring circuits on the modem card to the jack.

13. The computer system as defined in claim 9 wherein the I/O means comprises an antenna mounted on the chassis, and further wherein the PCMCIA card comprises a communications card having at least one flat contact to electrically couple at least one circuit on the communications card to the antenna.

* * * * *